United States Patent
Chen et al.

(10) Patent No.: US 12,293,924 B2
(45) Date of Patent: May 6, 2025

(54) ION EXPOSURE METHOD AND APPARATUS

(71) Applicant: Taiwan Semiconductor Manufacturing Co., Ltd., Hsinchu (TW)

(72) Inventors: Chia-Cheng Chen, Hsinchu (TW); Wei-Ting Chien, Hsinchu (TW); Liang-Yin Chen, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 18/415,411

(22) Filed: Jan. 17, 2024

(65) Prior Publication Data

US 2024/0203749 A1    Jun. 20, 2024

Related U.S. Application Data

(63) Continuation of application No. 17/855,216, filed on Jun. 30, 2022, now Pat. No. 11,915,942, which is a continuation of application No. 17/205,958, filed on Mar. 18, 2021, now Pat. No. 11,393,695.

(51) Int. Cl.
| | | |
|---|---|---|
| *G03F 7/20* | (2006.01) | |
| *G03F 7/00* | (2006.01) | |
| *H01L 21/027* | (2006.01) | |
| *H01L 21/32* | (2006.01) | |

(52) U.S. Cl.
CPC .......... *H01L 21/32* (2013.01); *G03F 7/70283* (2013.01); *H01L 21/027* (2013.01)

(58) Field of Classification Search
CPC . H01L 21/32; H01L 21/027; H01L 21/26586; H01L 21/31105; H01L 21/31116; H01L 21/32131; H01L 21/32136; H01L 21/0337; G03F 7/70283
See application file for complete search history.

(56) References Cited

U.S. PATENT DOCUMENTS

2016/0133469 A1    5/2016    Wan et al.
2018/0005830 A1    1/2018    Laven et al.

OTHER PUBLICATIONS

Current, M.I. et al., "Commercial Ion Implantation Systems," Chapter 3, Sep. 2018, downloaded from https://www.researchgate.net/publication/330357221_Commercial_Ion_Implantation_Systems on Feb. 12, 2020, 42 pages.

*Primary Examiner* — Mesfin T Asfaw
(74) *Attorney, Agent, or Firm* — Slater Matsil, LLP

(57) ABSTRACT

A method of exposing a wafer to a high-tilt angle ion beam and an apparatus for performing the same are disclosed. In an embodiment, a method includes forming a patterned mask layer over a wafer, the patterned mask layer including a patterned mask feature; exposing the wafer to an ion beam, a surface of the wafer being tilted at a tilt angle with respect to the ion beam; and moving the wafer along a scan line with respect to the ion beam, a scan angle being defined between the scan line and an axis perpendicular to an axis of the ion beam, a difference between the tilt angle and the scan angle being less than 50°.

20 Claims, 9 Drawing Sheets

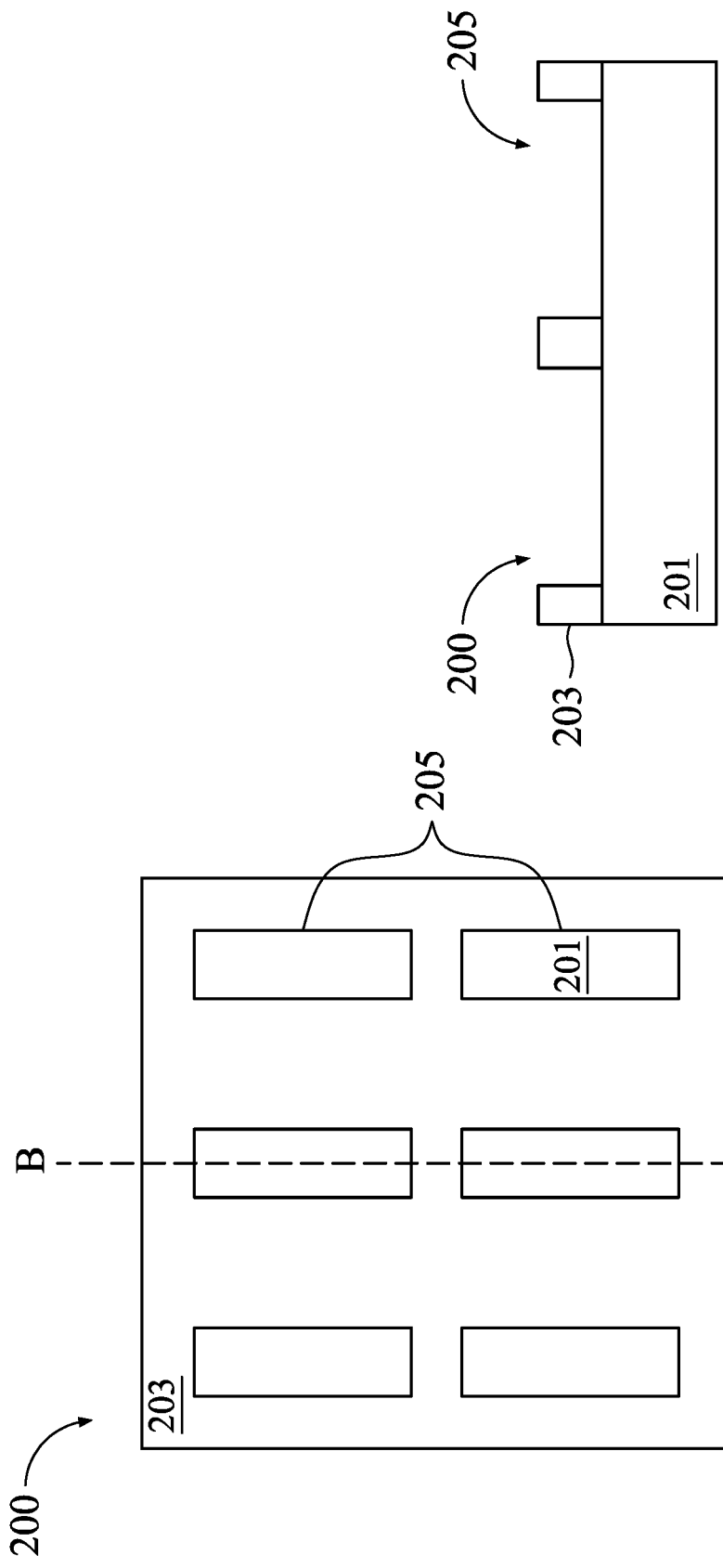

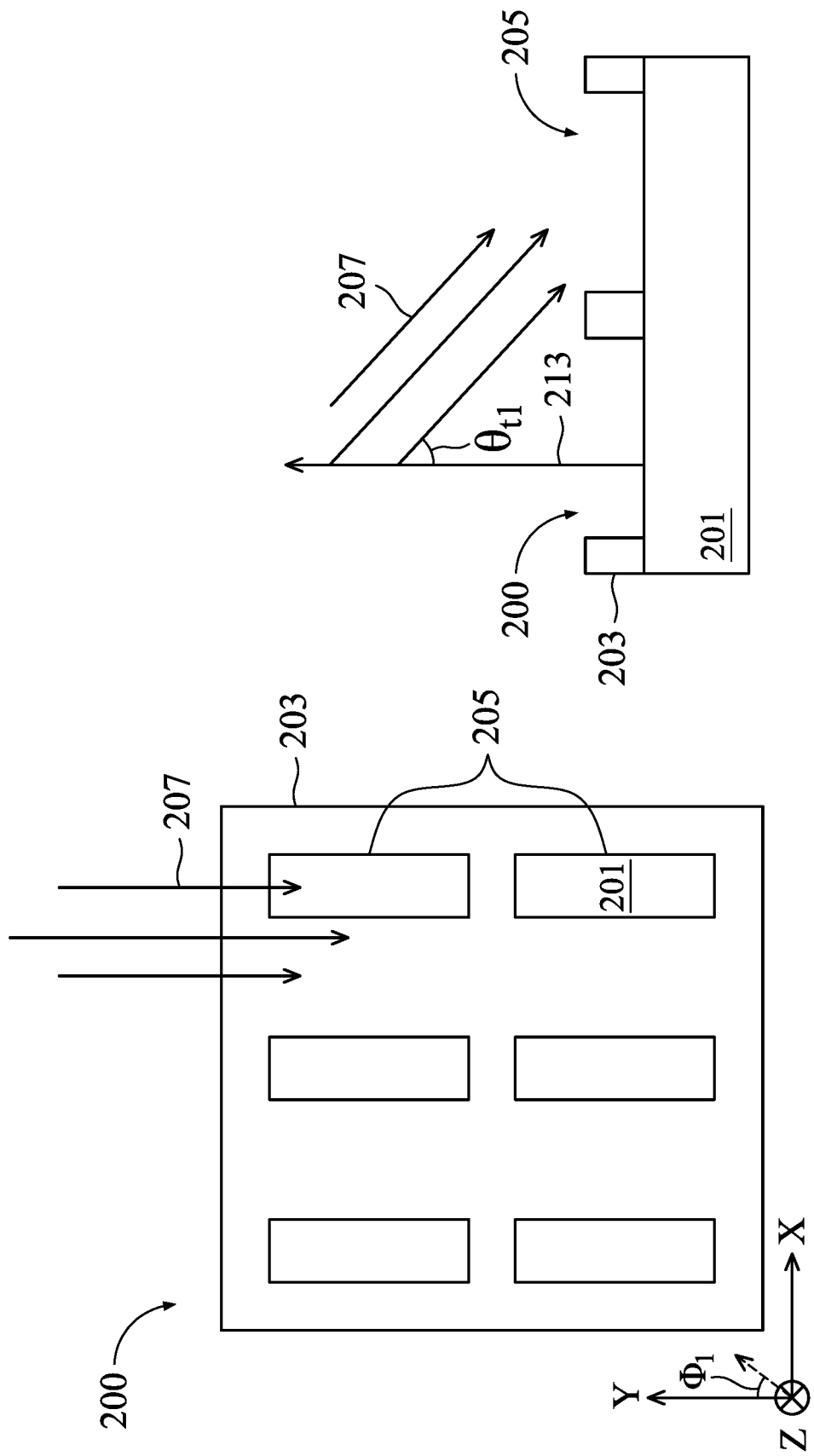

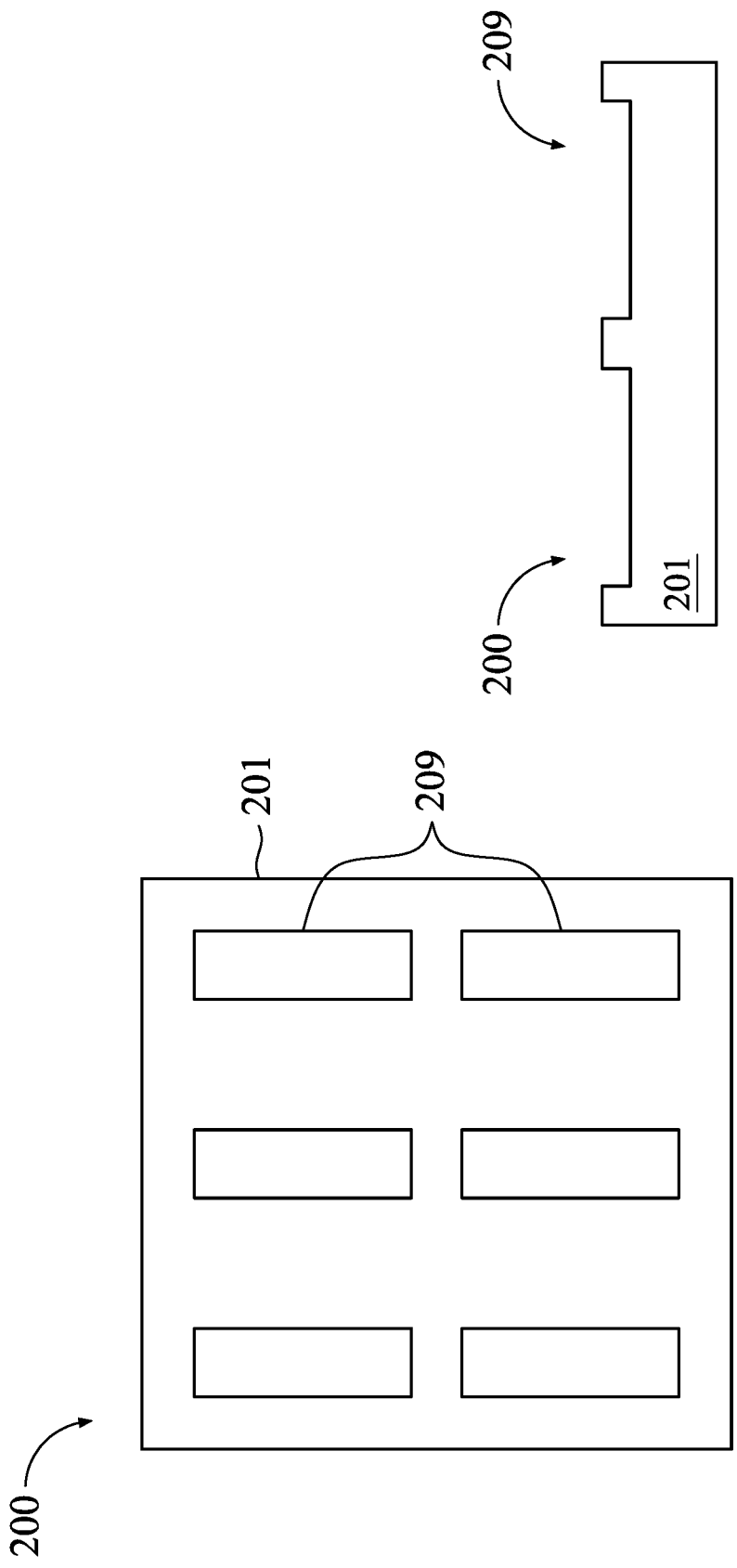

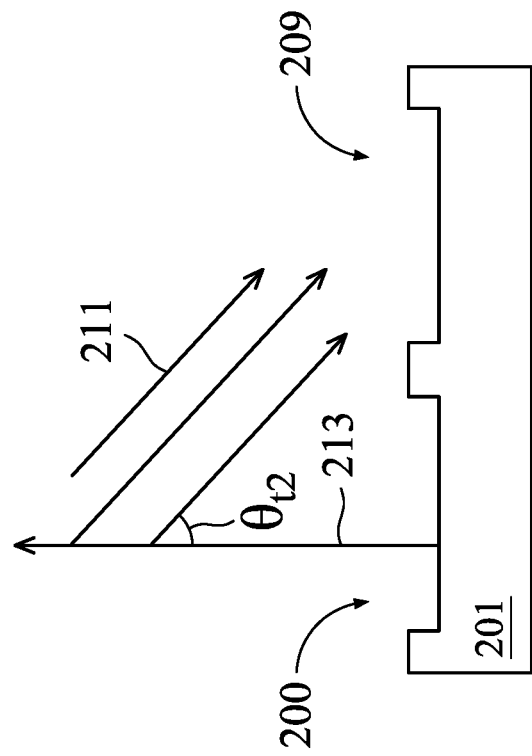
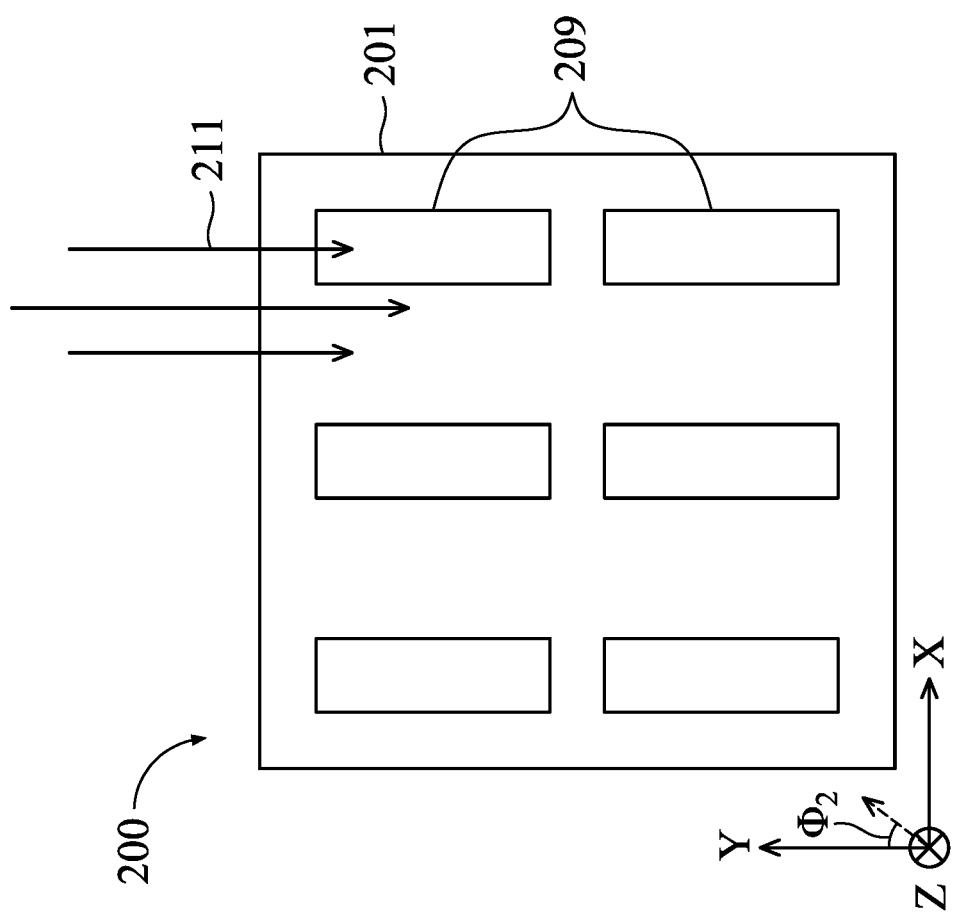
Figure 5B
Figure 5A

ION EXPOSURE METHOD AND APPARATUS

CROSS-REFERENCE TO RELATED APPLICATIONS

This application is a continuation of U.S. patent application Ser. No. 17/855,216, filed Jun. 30, 2022, and entitled "Ion Exposure Method and Apparatus," now U.S. Pat. No. 11,915,942, issued Feb. 27, 2024, which is a continuation of U.S. patent application Ser. No. 17/205,958, filed Mar. 18, 2021, and entitled "Ion Exposure Method and Apparatus," now U.S. Pat. No. 11,393,695, issued Jul. 19, 2022, which are hereby incorporated by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 3A, 3B, 4A, 4B, 5A, and 5B are cross-sectional views of intermediate stages in the manufacturing of a semiconductor device according to the method, in accordance with some embodiments.

DETAILED DESCRIPTION

Figure 1:
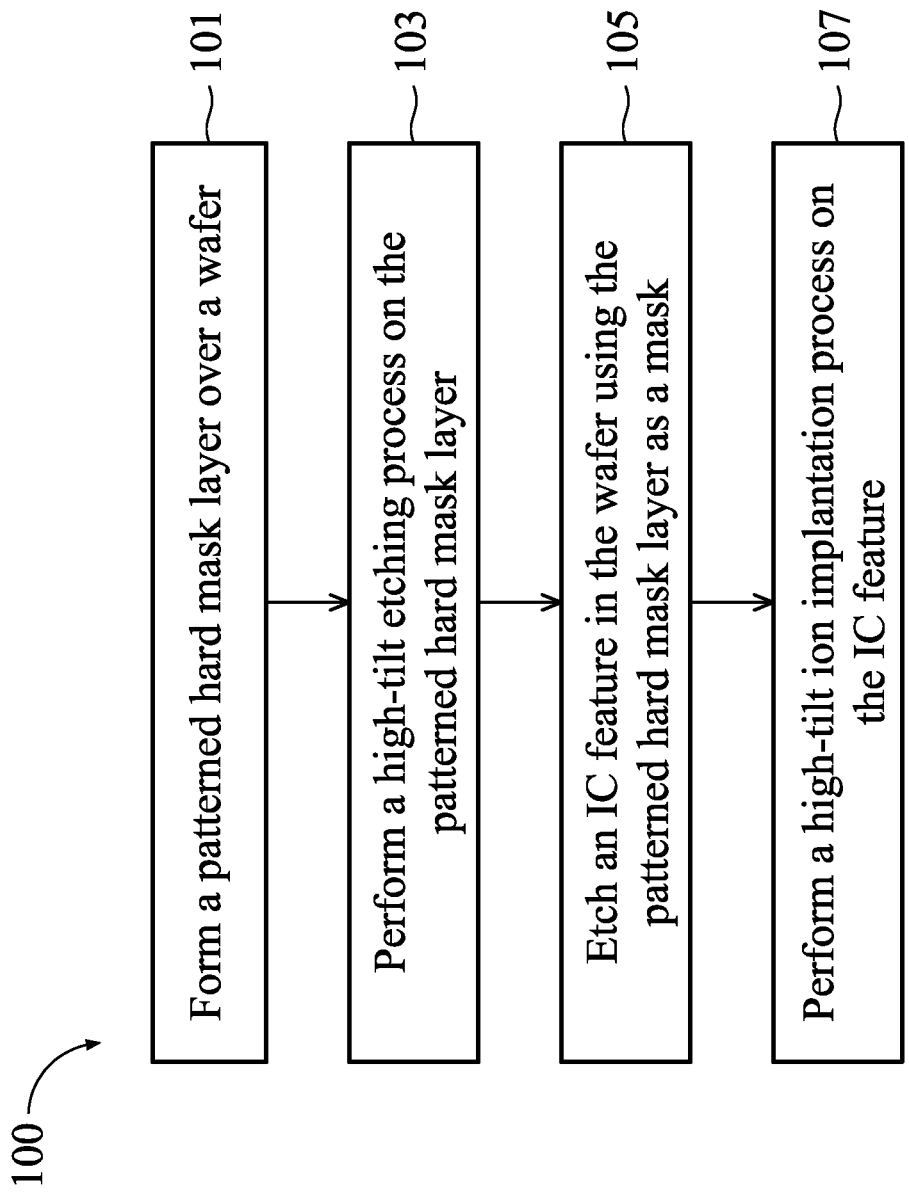
FIG. 1 is a flow chart of a method of performing a high-tilt angle ion exposure process, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide an improved ion exposure device (subsequently referred to as an ion implanter) and methods of using the same. The ion implanter includes a wafer handling unit which moves a wafer relative to an ion beam during an ion exposure process. The wafer handling unit tilts the wafer and moves the wafer in a direction such that a difference between a tilt angle and a scan angle is less than a predetermined value. The tilt angle is an angle between an axis perpendicular to a major surface of the wafer and an axis of the ion beam. The scan angle is an angle between a scan line along which the wafer is moved by the wafer handling unit and an axis perpendicular to the axis of the ion beam. In some embodiments, the predetermined value may be about 50°. Keeping the scan angle within the predetermined value of the tilt angle allows for high-tilt ion implantations and/or high-tilt ion etching (collectively referred to as high-tilt ion processes) to be performed with improved within wafer uniformity, while minimizing the size of the process chamber in which the ion implantation is performed. Additionally, keeping the scan angle within the predetermined value of the tilt angle may allow for high-tilt ion processes to be performed with improved wafer uniformity in existing process chambers, without requiring modification to the process chambers.

FIG. 1 illustrates a flow chart of a method 100 including various high-tilt angle ion exposure processes, in accordance with some embodiments. The method 100 may be implemented in the fabrication of semiconductor devices. The method 100 may include ion etching steps, ion implantation steps, multiples or combinations thereof, or the like. In step 101, a patterned hard mask layer is formed over a wafer. The patterned hard mask layer may include a hard mask feature, such as an opening or a line. In some embodiments, the hard mask feature corresponds to an integrated circuit (IC) feature to be formed for a semiconductor device. In step 103, an optional high-tilt etching process is performed to modify a horizontal profile of the hard mask feature. The high-tilt etching process directs etching species (e.g., etching ions) with a high tilt angle with respect to an axis perpendicular to a major surface of the wafer. For example, a tilt angle between the axis perpendicular to the major surface of the wafer and an axis of an ion beam used for the high-tilt etching process may be from about 40° to about 89.9° or from about 60° to about 89.9°. In step 105, an IC feature is formed on and/or in the wafer. The IC feature corresponds with the hard mask feature. In step 107, an optional high-tilt implantation process is performed to modify the IC feature. The high-tilt implantation process directs ions to be implanted with a high tilt angle with respect to the axis perpendicular to the major surface of the wafer. For example, a tilt angle between the axis perpendicular to the major surface of the wafer and an axis of an ion beam used for the high-tilt implantation process may be from about 40° to about 89.9° or from about 60° to about 89.9°. Additional steps may be provided before, during, and after method 100, and some of the steps described may be moved, replaced, or eliminated for additional embodiments of method 100.

FIGS. 2A through 5B illustrate an embodiment in which the method 100 is performed on a patterned hard mask layer 203 over a wafer 201 in a semiconductor device 200. The semiconductor device 200 may be an integrated circuit (IC) chip, a system on chip (SoC), or portion thereof. The semiconductor device 200 may include various active and/or passive devices such as resistors, capacitors, inductors, fuses, diodes, P-channel field effect transistors (PFETs), N-channel field effect transistors (NFETs), metal-oxide-semiconductor field effect transistors (MOSFETs), complementary metal-oxide-semiconductor (CMOS) transistors, high voltage transistors, high frequency transistors, other suitable components, combinations thereof, or the like. FIGS. 2A through 5B have been simplified for the sake of clarity to better understand the inventive concepts of the present disclosure. Additional features may be added to the semiconductor device 200, and some of the features described below may be replaced, modified, or eliminated in other embodiments of the semiconductor device 200.

FIGS. 2A and 2B illustrate step 101 of the method 100. As illustrated in FIGS. 2A and 2B, the semiconductor device 200 includes a wafer 201. The wafer 201 may include various material layers (e.g., dielectric material layers, semiconductor material layers, conductive material layers, and/or the like) and/or IC features (e.g., doped regions/features, gate features, interconnect features, and/or the like), depending on the stage of IC fabrication in which the method 100 is performed. In the embodiment illustrated in FIGS. 2A and 2B, the various material layers and IC features of the wafer 201 are formed over a substrate, such as a silicon substrate. In some embodiments, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In some embodiments, the substrate is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other suitable methods.

A patterned hard mask layer 203 may be formed over the wafer 201 using any suitable processes. In some embodiments, forming the patterned hard mask layer 203 may include depositing a hard mask layer over the wafer 201 and patterning the hard mask layer using a lithography process to form the patterned hard mask layer 203. The hard mask layer may be deposited by chemical vapor deposition (CVD), atomic layer deposition (ALD), or the like. The hard mask layer may be formed of silicon oxide, silicon nitride, silicon carbide, amorphous silicon, titanium nitride, silicon oxynitride, silicon carbonitride, combinations or multiple layers thereof, or the like.

A patterned mask (not separately illustrated), such as a patterned photoresist, may be formed over the hard mask layer. The patterned mask may be formed by depositing a photosensitive layer over the hard mask layer using spin-on coating or the like. The photosensitive layer may then be patterned by exposing the photosensitive layer to a patterned energy source (e.g., a patterned light source) and developing the photosensitive layer to remove an exposed or unexposed portion of the photosensitive layer, thereby forming the patterned mask. The hard mask layer may be etched by a suitable etching process, such as reactive ion etching (RIE), neutral beam etching (NBE), the like, or a combination thereof in order to transfer the pattern of the patterned mask to the hard mask layer, forming openings 205 in the patterned hard mask layer 203. In some embodiments, the etching process may be anisotropic. The patterned mask may then be removed by any acceptable process, such as an ashing process, a stripping process, the like, or a combination thereof.

Although step 103 of the method 100 is described below as being performed on the patterned hard mask layer 203, in some embodiments, the high-tilt etching process may be performed on the patterned mask in addition to, or in alternative to the patterned hard mask layer 203. For example, the high-tilt etching process may be performed on the patterned mask after developing the photosensitive layer and before performing the etching process used to transfer the pattern of the patterned mask to the hard mask layer. Moreover, in some embodiments, ions may be implanted into the patterned hard mask layer 203 and/or the patterned mask in a high-tilt implantation process in order to harden the sidewalls of the patterned hard mask layer 203 and/or the patterned mask which are exposed to the ions. Performing any combination of the high-tilt etching process and the high-tilt implantation process may be used to improve the reliability of the pattern formed in the patterned hard mask layer 203 (e.g., reduce corner rounding, improve line edge roughness and line width roughness, and decrease critical dimensions), reducing device defects and improving device performance.

FIGS. 3A and 3B illustrate step 103 of the method 100. In FIGS. 3A and 3B, the high-tilt etching process is performed to modify a horizontal profile of the hard mask features of the patterned hard mask layer 203. In some embodiments, the high-tilt etching process may be used to reduce the spacing between adjacent openings 205 in the patterned hard mask layer 203, to reduce the rounding of corners of the openings 205, to improve line edge roughness (LER) and line width roughness (LWR) of the openings 205, or the like. The high-tilt etching process may be a selective dry etching process that selectively etches the patterned hard mask layer 203 relative to the wafer 201. The high-tilt etching process may direct an etching species 207 at a high tilt angle $\theta_{t1}$ with respect to an axis 213 perpendicular to a major surface of the wafer 201, thereby achieving horizontal etching of the patterned hard mask layer 203. In some embodiments, the tilt angle $\theta_{t1}$ may be from about 40° to about 89.9° or from about 60° to about 89.9°. In some embodiments, the wafer 201 may be secured to a wafer stage during the high-tilt etching process and the wafer stage may be tilted in order to control the tilt angle $\theta_{t1}$ of the wafer 201.

As illustrated in FIG. 3A, the etching species 207 may be further directed in an in-plane direction, which generally refers to directing the etching species 207 horizontally at any angle $\varphi_1$ relative to an axis in the horizontal plane, such as a Y-axis or an X-axis. The angle $\varphi_1$ may be from about 0° to about 360°, depending on the desired high-tilt etching process. In the embodiment illustrated in FIG. 3A, the etching species 207 may be directed in a y-direction over the surface of the wafer 201 with the angle $\varphi_1$ being about 180° relative to the Y-axis. As such, the etching species 207 may remove portions of the patterned hard mask layer 203 in the y-direction, while portions of the patterned hard mask layer 203 are removed minimally in the x-direction and/or the z-direction. In embodiments in which the wafer 201 is secured to the wafer stage, the wafer stage may be rotated in order to control the angle $\varphi_1$ of the wafer 201. In some embodiments, the high-tilt etching process may be repeated and the wafer stage may be rotated to different angles $\varphi_1$ to provide desired etching of the patterned hard mask layer 203.

In various embodiments, the etching species 207 may include ions formed from argon (Ar), helium (He), silane ($SiH_4$), methane ($CH_4$), oxygen ($O_2$), nitrogen ($N_2$), carbon dioxide ($CO_2$), carbon monoxide (CO), combinations thereof, or the like. The etching species 207 may be delivered using an ion beam having a dose from about $1\times10^{10}$ atoms/cm$^2$ to about $1\times10^{19}$ atoms/cm$^2$, with an energy from about 0.2 keV to about 10 MeV or from about 0.2 keV to about 100 keV, at a temperature from about −100° C. to about 500° C.

FIGS. 4A and 4B illustrate step 105 of the method 100. In FIGS. 4A and 4B, the pattern of the patterned hard mask layer 203 is transferred to the wafer 201, such that IC features are formed on and/or in the wafer 201 and the patterned hard mask layer 203 is removed. For example, as illustrated in FIGS. 4A and 4B, trenches 209 may be formed in the wafer 201 (e.g., the various material layers, the IC features, the substrate, and/or the like of the wafer 201) corresponding to the openings 205 in the patterned hard mask layer 203 illustrated in FIGS. 3A and 3B. The trenches may be etched by a suitable etching process, such as reactive ion etching (RIE), neutral beam etching (NBE), the like, or a combination thereof using the patterned hard mask layer 203 as a mask. In some embodiments, the etching process may be anisotropic. The patterned hard mask layer 203 may be removed by an etching process (e.g., a wet etching process, a dry etching process, or the like) or the like. In some embodiments, the patterned hard mask layer 203 may be consumed during the patterning of the wafer 201.

Although not separately illustrated, in some embodiments, a deposition process may be performed to fill the openings 205 rather than using the openings 205 to etch the wafer 201. For example, a dielectric material, a semiconductor material, or a conductive material may be deposited in the openings 205. In such embodiments, removing the patterned hard mask layer 203 leaves a patterned material layer over the wafer 201, which is patterned with a negative image of the patterned hard mask layer 203. Step 107 may be performed on the patterned material layer in order to implant ions into the patterned material layer.

FIGS. 5A and 5B illustrate step 107 of the method 100. In FIGS. 5A and 5B, the high-tilt implantation process is performed to modify sidewalls of remaining portions of the wafer 201. In embodiments in which the patterned material layer is formed over the wafer 201, the high-tilt implantation process may be performed to modify sidewalls of the patterned material layer. In some embodiments, the high-tilt implantation process may be used to modify various properties of the sidewalls of the wafer 201. For example, the high-tilt implantation process may be used to modify the etching rate, the hardness, the volume, the density, electrical characteristics, combinations thereof, or the like of the wafer 201. The high-tilt implantation process may direct an implantation species 211 at a high tilt angle $\theta_{t2}$ with respect to the axis 213 perpendicular to the major surface of the wafer 201, thereby achieving horizontal implantation of sidewalls of the wafer 201. In some embodiments, the tilt angle $\theta_{t2}$ may be from about 40° to about 89.9° or from about 60° to about 89.9°. In some embodiments, the wafer 201 may be secured to a wafer stage during the high-tilt etching process and the wafer stage may be tilted in order to control the tilt angle $\theta_{t2}$ of the wafer 201.

As illustrated in FIG. 5A, the implantation species 211 may be further directed in an in-plane direction, which generally refers to directing the implantation species 211 horizontally at any angle $\varphi_2$ relative to an axis in the horizontal plane, such as the Y-axis or the X-axis. The angle $\varphi_2$ may be from about 0° to about 360°, depending on the desired high-tilt implantation process. In the embodiment illustrated in FIG. 5A, the implantation species 211 may be directed in a y-direction over the surface of the wafer 201 with the angle $\varphi_2$ being about 180° relative to the Y-axis. As such, the implantation species 211 may be implanted into sidewalls of the wafer 201 in the y-direction, while portions of the wafer 201 are implanted minimally in the x-direction and/or the z-direction. In embodiments in which the wafer 201 is secured to the wafer stage, the wafer stage may be rotated in order to control the angle $\varphi_2$ of the wafer 201. In some embodiments, the high-tilt implantation process may be repeated and the wafer stage may be rotated to different angles $\varphi_2$ to provide desired implantation of the wafer 201.

In various embodiments, the implantation species 211 may include ions formed from boron (B), aluminum (Al), gallium (Ga), indium (In), carbon (C), silicon (Si), germanium (Ge), nitrogen ($N_2$), phosphorous (P), arsenic (As), antimony (Sb), oxygen ($O_2$), fluorine ($F_2$), helium (He), argon (Ar), carbon monoxide (CO), carbon dioxide ($CO_2$), boron mono-fluoride (BF), boron di-fluoride ($BF_2$), boron tri-fluoride ($BF_3$), silicon mono-fluoride (SiF), silicon di-fluoride ($SiF_2$), silicon tri-fluoride ($SiF_3$), silicon tetrafluoride ($SiF_4$), phosphorous dimer ($P_2$), silane ($SiH_4$), methane ($CH_4$), combinations thereof, or the like. The implantation species 211 may be delivered using an ion beam having a dose from about $1\times10^{10}$ atoms/cm$^2$ to about $1\times10^{19}$ atoms/cm$^2$, with an energy from about 0.2 keV to about 10 MeV, at a temperature from about −100° C. to about 500° C.

Although not separately illustrated, in some embodiments, the trenches 209 may then be filled. The trenches 209 may be filled with a dielectric material to form isolation features such as shallow trench isolation (STI) features, inter-dielectric layers (ILDs), or the like. The trenches 209 may be filled with semi-conductive and/or conductive material to form semi-conductive and/or conductive features, such as conductive vias, conductive lines, conductive contacts, gate structures, or the like.

As discussed previously, step 103 of the method 100, the high-tilt etching process, may be used to provide directional patterning, which may be used to reduce feature-to-feature spacing between IC features below lithographic process limits, reduce corner rounding of openings 205 formed in the patterned hard mask layer 203, to improve line edge roughness and line width roughness of the openings 205, and the like. Step 107 of the method 100, the high-tilt implantation process, may be used to provide directional implantation, which may be used to selectively modify various properties of sidewalls of the wafer 201. For example, step 107 may be used to modify the etching rate, the hardness, the volume, electrical characteristics, combinations thereof, or the like of sidewalls of the wafer 201. Both steps 103 and 107 may be used to reduce device defects and to improve device performance.

Figure 6:
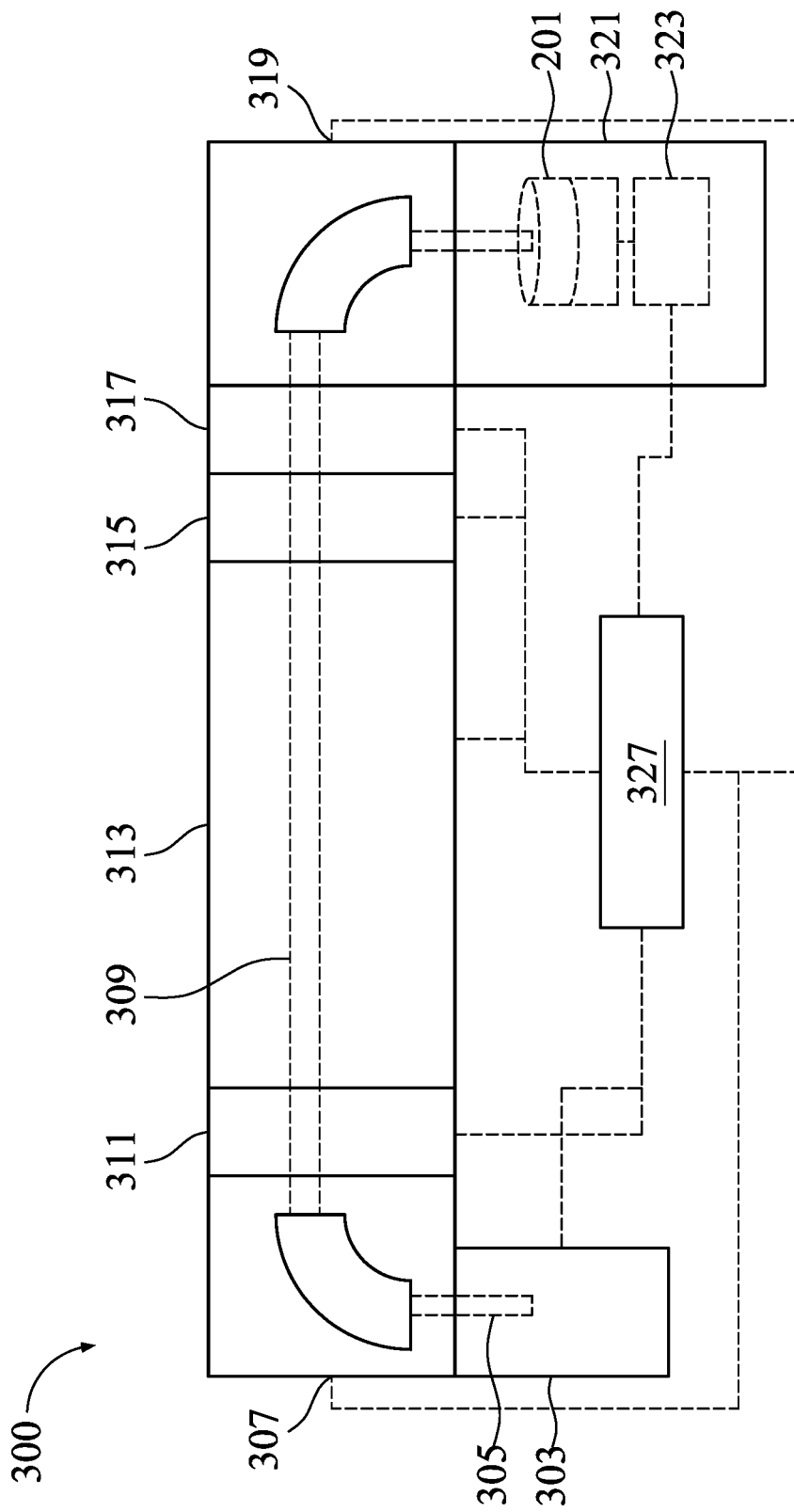
FIG. 6 is a plan view of an ion implanter, which may be used to perform the method, in accordance with some embodiments.

FIG. 6 illustrates an ion implanter 300, which may be used to expose a wafer 201 to an ion beam for ion implantation, ion etching, or the like, in accordance with some embodiments. In some embodiments, the ion implanter 300 may be used to direct an ion beam at the wafer 201 in order to perform the high-tilt etching process and/or the high-tilt implantation process of steps 103 and 107, respectively, of the method 100. As illustrated in FIG. 6, the ion implanter 300 may include an ion source 303, a mass analysis magnet 307, an aperture 311, a linear accelerator 313, a scanning unit 315, a converging unit 317, a final energy magnet 319, an end station 321, a wafer handling unit 323 and a controller 327 to control the operation of the ion implanter 300. Each of these pieces will be discussed in the following paragraphs.

The ion source 303 may include a variety of components which are used to generate an ion beam 305. For example, the ion source 303 may include ion separation devices, ion acceleration devices, multiples or combinations thereof, or the like. In some embodiments, the ion source 303 may be an arc discharge ion source. The ion source 303 may generate the ion beam from various atoms or molecules, which may include boron (B), aluminum (Al), gallium (Ga), indium (In), carbon (C), silicon (Si), germanium (Ge), nitrogen ($N_2$), phosphorous (P), arsenic (As), antimony (Sb), oxygen ($O_2$), fluorine ($F_2$), helium (He), argon (Ar), carbon monoxide (CO), carbon dioxide ($CO_2$), boron mono-fluoride (BF), boron di-fluoride ($BF_2$), boron tri-fluoride ($BF_3$), silicon mono-fluoride (SiF), silicon di-fluoride ($SiF_2$), silicon tri-fluoride ($SiF_3$), silicon tetrafluoride ($SiF_4$), phosphorous dimer ($P_2$), silane ($SiH_4$), methane ($CH_4$), combinations thereof, or the like.

The ion source 303 may produce ions having a broad range of charge-to-mass ratios with only a certain narrower range of charge-to-mass ratios being suitable for implantation. As such, the ion beam 305 may be directed towards the mass analysis magnet 307. The mass analysis magnet 307 electromagnetically separates those ions having desired charge-to-mass ratios for implantation from those ions having undesired charge-to-mass ratios. Once a coherent ion beam 309 of ions having suitable charge-to-mass ratios is obtained, the coherent ion beam 309 may be sent to the aperture 311.

After the coherent ion beam 309 is obtained by the mass analysis magnet 307, the coherent ion beam 309 passes through the aperture 311 in order to further enhance and control the divergence of the coherent ion beam 309. In some embodiments, the aperture 311 is an aperture with an adjustable width that can adjust the magnitude of the coherent ion beam 309. For example, the aperture 311 may include adjustable and movable plates such that a spacing between the plates can be adjusted, thereby allowing for an adjustment of the beam current magnitude. Once the coherent ion beam 309 passes through the aperture 311, the coherent ion beam 309 may be sent to the linear accelerator 313.

The linear accelerator 313 may be used to impart additional energy to the coherent ion beam 309 as it passes through the linear accelerator 313. The linear accelerator 313 imparts this additional energy using a series of electrodes (not separately illustrated) that generate an electromagnetic field. When the coherent ion beam 309 passes through the electromagnetic field, the electromagnetic field works to accelerate the coherent ion beam 309. The linear accelerator 313 may include multiple electromagnetic fields and may vary the electromagnetic fields periodically with time or may adjust the phase of the electromagnetic fields to accommodate ions with different atomic numbers as well as ions having different initial speeds.

Once accelerated, the coherent ion beam 309 is directed towards the scanning unit 315. The scanning unit 315 may be used to scan the coherent ion beam 309 across the surface of the wafer 201. The scanning unit 315 may include at least a pair of horizontal electrodes and a pair of vertical electrodes for controlling horizontal scanning and vertical scanning of the coherent ion beam 309, respectively. In some embodiments, the scanning unit 315 may function to scan the coherent ion beam 309 to cover the entire wafer width of the wafer 201.

After the coherent ion beam 309 is passed through the scanning unit 315, the coherent ion beam is passed through the converging unit 317. The converging unit 317 may be utilized to modify the convergence and divergence of the coherent ion beam 309, which may arrive from the linear accelerator 313 to the scanning unit 315 as a substantially parallel beam. In some embodiments, the converging unit 317 includes one or more (such as three) multipole lenses. The multipole lenses may include a uniformity multipole lens, a collimator multipole lens, combinations thereof, or the like. However, any suitable number and type of lenses may be utilized.

After the coherent ion beam 309 is passed through the converging unit 317, the coherent ion beam 309 is passed through the final energy magnet 319. The final energy magnet 319 may be used to remove ions and/or neutral particles that have been generated with undesired charge-to-mass ratios during the previous process of the ion implanter. The final energy magnet 319 may be similar to the mass analysis magnet 307 and may electromagnetically separate ions having desired charge-to-mass ratios for implantation from those ions having undesired charge-to-mass ratios.

After the coherent ion beam 309 is passed through the final energy magnet 319, the coherent ion beam 309 is delivered to the end station 321. The end station 321 may house the wafer handling unit 323, which handles the wafer 201 which will be implanted with ions from the coherent ion beam 309. The wafer handling unit 323 is utilized to move the wafer 201 in relation to the coherent ion beam 309 so as to illuminate different sections of the wafer 201 with the coherent ion beam 309. For example, the wafer handling unit 323 may include two motors (not separately illustrated) which may be used to control the position of the wafer 201 in at least two directions, such as an x-direction and a y-direction, relative to the coherent ion beam 309.

In some embodiments, the wafer handling unit 323 may include more than two motors. The wafer handling unit 323 may be used to control the position of the wafer 201 in at least three directions, such as the x-direction, the y direction, and a z-direction relative to the coherent ion beam 309. The wafer handling unit 323 may further control a tilt angle of the wafer 201 relative to an axis of the coherent ion beam 309. The wafer handling unit 323 may move the wafer 201 at a scan angle, which is an angle between a scan line along which the wafer handling unit 323 moves the wafer 201 and an axis perpendicular to the axis of the coherent ion beam 309. As will be discussed in the following paragraphs, the scan angle may be controlled using the wafer handling unit 323 to improve the uniformity of ion implantations with high tilt angles, while minimizing the size of a process chamber in which the ion implantation is performed.

In some embodiments, the coherent ion beam 309 may be delivered to the end station 321 as a spot beam, which has a circular cross-section. In some embodiments, the coherent ion beam 309 may be delivered to the end station 321 as a ribbon beam, which has a rectangular cross-section. The wafer handling unit 323 and the scanning unit 315 may be used in conjunction to scan the coherent ion beam 309 across the surface of the wafer 201 such that a uniform ion distribution is achieved across the surface of the wafer 201.

The controller 327 is used to control the operating parameters of the ion implanter 300 during operation. The controller 327 may be implemented in either hardware or software, and the parameters may be hardcoded or fed into the controller 327 through an input port. The controller 327 may be used to store and control parameters associated with the operation of the ion implanter 300, such as the desired ion beam current, the current to the accelerator electrodes, and the like. Additionally, the controller 327 may also be used to control the wafer handling unit 323 and, more specifically, the motors of the wafer handling unit 323, which, in turn, control the position, direction of movement, and tilt angle of the wafer 201 with respect to the coherent ion beam 309.

Figure 7:
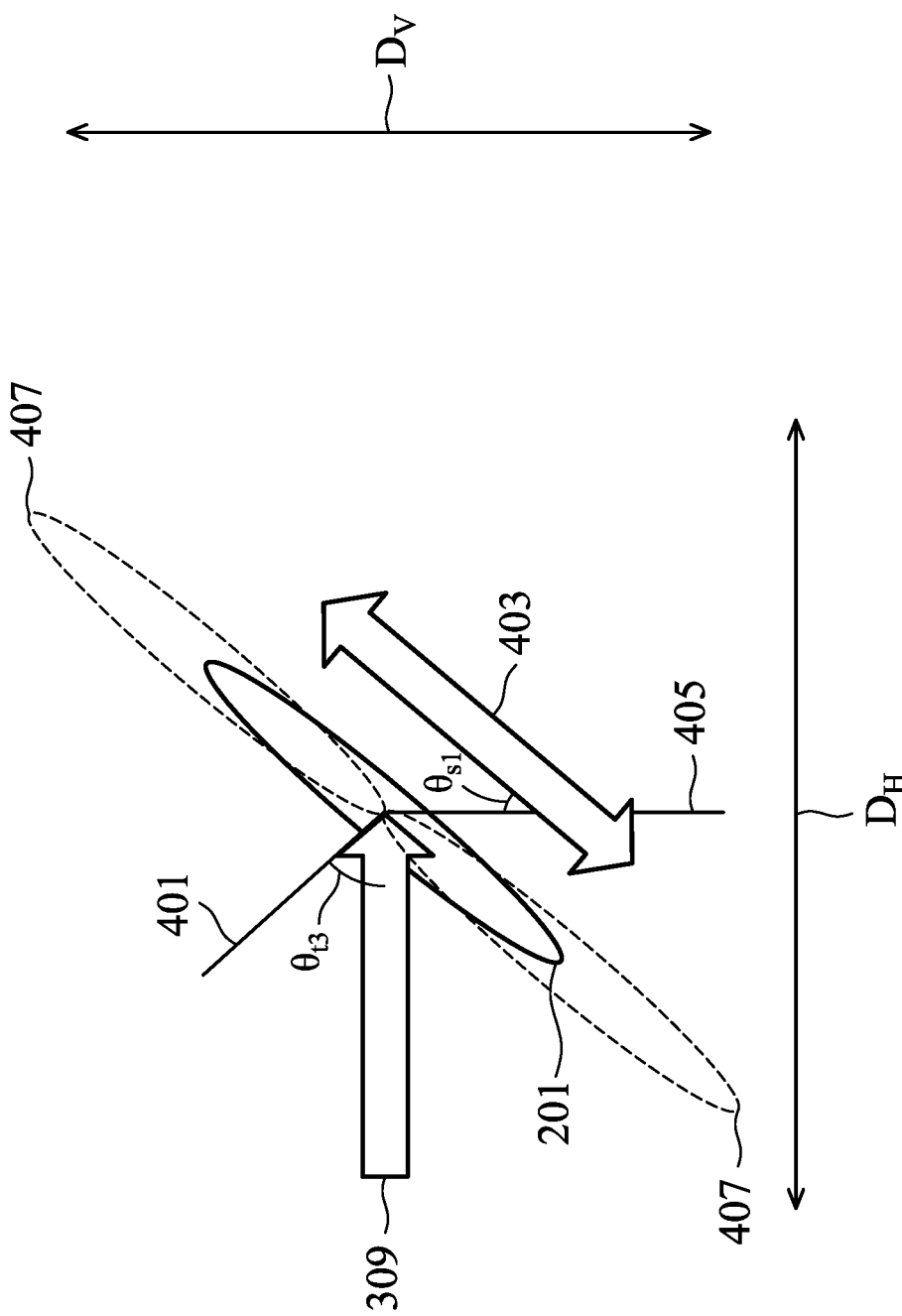
FIGS. 7, 8, and 9 are isometric views of movement of a wafer during exposure of the wafer to an ion beam, in accordance with some embodiments.
Figure 8:
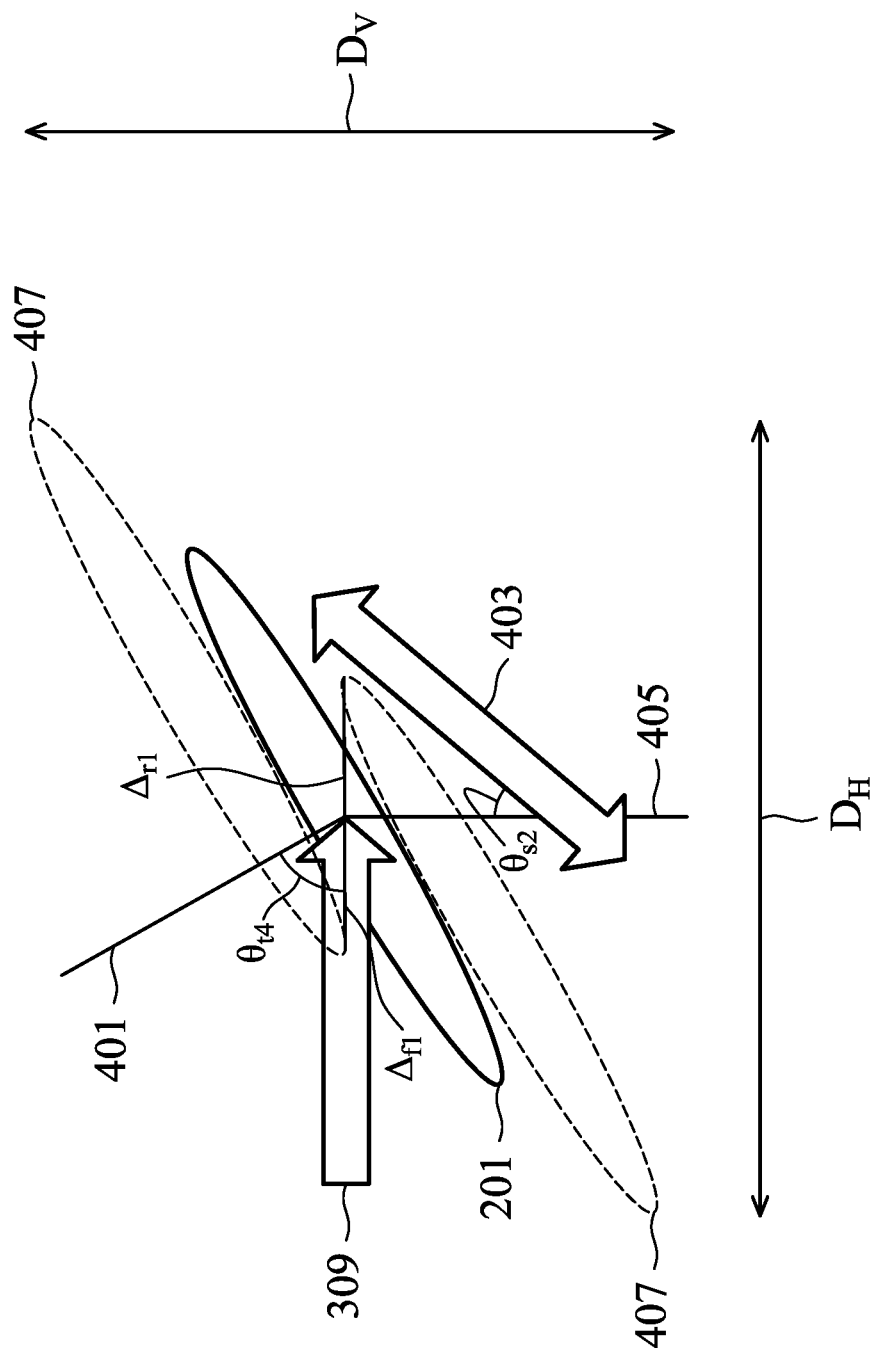
Figure 9:
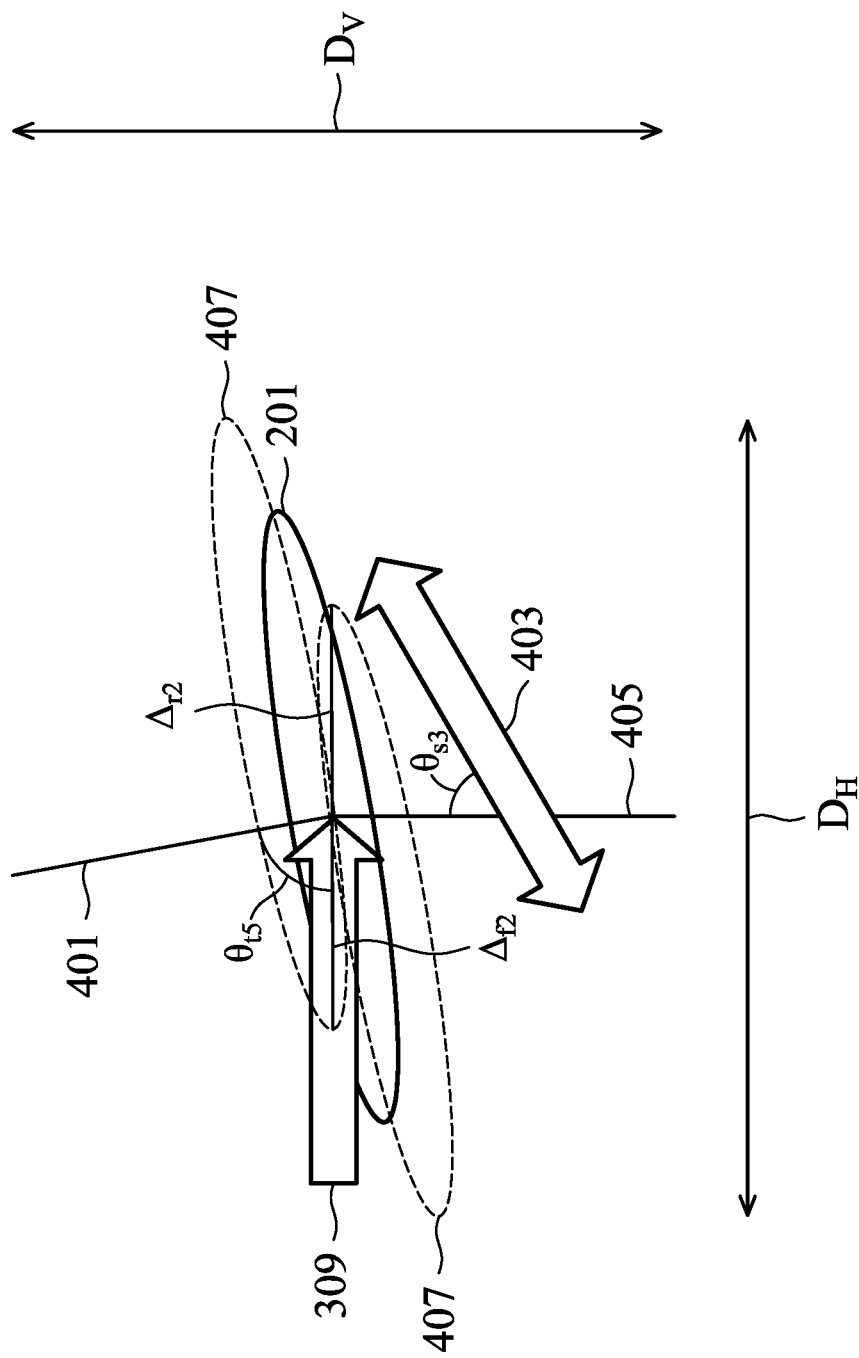

FIGS. 7 through 9 illustrate movement of the wafer 201 with respect to the coherent ion beam 309, in accordance with some embodiments. The movement patterns illustrated in FIGS. 7 through 9 may be used to expose the wafer 201 to the coherent ion beam 309 in order to perform the high-tilt etching process and the high-tilt implantation process of steps 103 and 107 (collectively referred to as high-tilt ion processes), respectively, of the method 100. The wafer handling unit 323 may be used to control the movement and tilt of the wafer 201 with respect to the coherent ion beam 309.

In the embodiments illustrated in FIGS. 7 through 9, a scan angle of the wafer 201 may be set based on a desired tilt angle of the wafer 201 and a size of the process chamber in which the high-tilt ion process is performed. The tilt angle is the angle between the axis of the coherent ion beam 309 and an axis 401 perpendicular to a major surface of the wafer 201. The wafer 201 moves in a movement direction 403. The scan angle is the angle between an axis 405 perpendicular to the axis of the coherent ion beam 309 and the movement direction 403. The wafer 201 may be moved along a scan line, which is parallel to the movement direction 403. The scan angle may be set to ensure that the entire surface of the wafer 201 is exposed to the coherent ion beam 309 with good uniformity.

Setting the scan angle equal to the tilt angle may provide good uniformity of exposure to the coherent ion beam 309 across the surface of the wafer 201, as the distance the coherent ion beam 309 travels before striking the surface of the wafer 201 is the same across the surface of the wafer 201. However, as the scan angle increases, the distance the wafer 201 must travel in the movement direction 403 in order to expose the entire surface of the wafer 201 to the coherent ion beam 309 also increases. The total distance that the wafer 201 may travel within a process chamber in which the wafer 201 is exposed to the coherent ion beam 309 may be limited by the size of the process chamber. As such, for high-tilt angle implantations, the scan angle may be set less than the tilt angle. However, as a difference between the scan angle and the tilt angle becomes greater, a variance in the distance traveled by the coherent ion beam 309 before striking the surface of the wafer 201 also becomes greater, which reduces the uniformity of exposure to the coherent ion beam 309 across the surface of the wafer 201.

In some embodiments, the scan angle may be set to be within a prescribed value of the tilt angle in order to ensure good uniformity of the exposure of the wafer 201 to the coherent ion beam 309. For example, the prescribed value may be about 50°, about 40°, or about 30°. In some embodiments, the scan angle may be set equal to the tilt angle up to threshold value and may then be set with the prescribed value of the tilt angle. For example, the scan angle may be set equal to the tilt angle up to about 40°, up to about 50°, or up to about 60°, and may then be set with the prescribed value of the tilt angle. In some embodiments, the scan angle may be set equal to 0° until the tilt angle reaches the prescribed value, and may then be set to be within the prescribed value of the tilt angle. In some embodiments, the scan angle may be greater than about 0° and less than the tilt angle. In some embodiments, the scan angle may have a maximum value, which may be related to the size of the process chamber in which the wafer 201 is exposed to the coherent ion beam 309. For example, the maximum value of the scan angle may be about 60°, about 89.9°, or the like.

The distance the wafer 201 travels in order for the entire surface of the wafer 201 to be exposed to the coherent ion beam 309 depends on the scan angle. In embodiments in which the scan angle varies from 0° to 89.9°, the entire surface of the wafer 201 may be exposed to the coherent ion beam 309 by moving the wafer 201 a distance ranging from about 0 mm to about 600 mm with a maximum value of about 600 mm in a horizontal direction DH and moving the wafer 201 a distance ranging from about 0 mm to about 600 mm with a maximum value of about 600 mm in a vertical direction Dy. In embodiments in which the scan angle varies from 0° to 60°, the entire surface of the wafer 201 may be exposed to the coherent ion beam 309 by moving the wafer 201 a distance ranging from about 300 mm to about 600 mm with a minimum value of about 300 mm and a maximum value of about 600 mm in the horizontal direction DH and moving the wafer 201 a distance ranging from about 0 mm to about 520 mm with a maximum value of about 520 mm in the vertical direction $D_V$. As such, limiting the maximum value of the scan angle may reduce the chamber size required to expose the entire surface of the wafer 201 to the coherent ion beam 309.

In some embodiments, the scan angle may be set such that a difference between a maximum distance that the coherent ion beam 309 travels before impinging the surface of the wafer 201 and a minimum distance that the coherent ion beam 309 travels before impinging the surface of the wafer 201 is less than a maximum value. For example, the maximum value may be about 150 mm, about 299.9 mm, or the like. The coherent ion beam 309 may travel the minimum distance before impinging the surface of the wafer 201 at a leading edge of the wafer 201 and the coherent beam may travel the maximum distance before impinging the surface of the wafer 201 at a trailing edge of the wafer 201. Setting the scan angle to ensure variations in the distance the coherent ion beam 309 travels are below the maximum value helps to improve the uniformity of exposure of the wafer 201 to the coherent ion beam 309.

FIG. 7 illustrates an embodiment in which the tilt angle $\theta_{t3}$ is 40°. In the embodiment illustrated in FIG. 7, the scan angle $\theta_{s1}$ may be set equal to the tilt angle $\theta_{t3}$ such that the scan angle is 40°. FIG. 7 further illustrates initial and final positions 407 of the wafer 201 in the movement direction 403. Because the scan angle $\theta_{s1}$ is equal to the tilt angle $\theta_{t3}$, the distance that the coherent ion beam 309 travels before contacting the surface of the wafer 201 is the same across the surface of the wafer 201 and the wafer 201 is exposed to the coherent ion beam 309 with good uniformity.

FIG. 8 illustrates an embodiment in which the tilt angle $\theta_{t4}$ is 60°. In the embodiment illustrated in FIG. 8, the scan angle $\theta_{s2}$ may be set to 40°. The difference between the tilt angle $\theta_{t4}$ and the scan angle $\theta_{s2}$ is 20°, which is less than the prescribed value.

FIG. 8 further illustrates initial and final positions 407 of the wafer 201 in the movement direction 403. As illustrated in FIG. 8, the distance the coherent ion beam 309 travels to reach a front edge of the wafer 201 is a distance $\Delta_{f1}$ less than a distance the coherent ion beam 309 travels to reach a central portion of the wafer 201, which is a distance $\Delta_{r1}$ less than a distance the coherent ion beam 309 travels to reach a rear edge of the wafer 201. Although there may be some variance in the distance the coherent ion beam 309 travels before contacting different portions of the surface of the wafer 201, because the difference between the tilt angle $\theta_{t4}$ and the scan angle $\theta_{s2}$ is less than the prescribed value, the variance is minimal and the wafer 201 is exposed to the coherent ion beam 309 with good uniformity.

FIG. 9 illustrates an embodiment in which the tilt angle $\theta_{t5}$ is 80°. In the embodiment illustrated in FIG. 9, the scan angle $\theta_{s3}$ may be set to 50°. The difference between the tilt angle $\theta_{t5}$ and the scan angle $\theta_{s3}$ is 30°, which is less than the prescribed value. FIG. 9 further illustrates initial and final positions 407 of the wafer 201 in the movement direction 403. As illustrated in FIG. 9, the distance the coherent ion beam 309 travels to reach a front edge of the wafer 201 is a distance $\Delta_{f2}$ less than a distance the coherent ion beam 309 travels to reach a central portion of the wafer 201, which is a distance $\Delta_{r2}$ less than a distance the coherent ion beam 309 travels to reach a rear edge of the wafer 201. Although there may be some variance in the distance the coherent ion beam 309 travels before contacting different portions of the surface of the wafer 201, because the difference between the tilt angle $\theta_{t5}$ and the scan angle $\theta_{s3}$ is less than the prescribed value, the variance is minimal and the wafer 201 is exposed to the coherent ion beam 309 with good uniformity.

In some embodiments, the scan angle may be set to maintain differences between the distances the coherent ion beam 309 travels to reach various portions of the wafer 201 (e.g., the distance $\Delta_{f1}$, the distance $\Delta_{r1}$, the distance $\Delta_{f2}$, and the distance $\Delta_{r2}$, discussed above with respect to the embodiments illustrated in FIGS. 8 and 9) below a maximum value. For example, the scan angle may be set such that differences between the distances the coherent ion beam 309 travels to reach various portions of the wafer 201 are less than about 150 mm, less than about 192.8 mm, less than about 229.8 mm, or the like.

As discussed above, setting the scan angle within the prescribed value of the tilt angle allows for high-tilt ion processes to be performed on the wafer 201 with good uniformity. Moreover, setting the scan angle such that differences between the distances the coherent ion beam 309 travels to reach various portions of the wafer 201 are less than the maximum value also allows for high-tilt ion processes to be performed with good uniformity. Moreover, because the scan angle may be set to be less than the tilt angle, the high-tilt ion processes may be performed across the entire surface of the wafer 201 in existing process chambers without modification.

In accordance with an embodiment, a method includes forming a patterned mask layer over a wafer, the patterned mask layer including a patterned mask feature; exposing the wafer to an ion beam, a surface of the wafer being tilted at a tilt angle with respect to the ion beam; and moving the wafer along a scan line with respect to the ion beam, a scan angle being defined between the scan line and an axis perpendicular to an axis of the ion beam, a difference between the tilt angle and the scan angle being less than 50°. In an embodiment, the scan angle is greater than 0°. In an embodiment, the tilt angle is from 40° to 89.9°. In an embodiment, the tilt angle is from 60° to 89.9°. In an embodiment, the scan angle is less than the tilt angle and the scan angle is greater than 0° when the tilt angle is greater than 0°. In an embodiment, the difference between the tilt angle and the scan angle is less than 30°. In an embodiment, the difference between the tilt angle and the scan angle is 0° when the tilt angle is less than or equal to 40°, and the difference between the tilt angle and the scan angle is less than 50° when the tilt angle is greater than 40°.

In accordance with another embodiment, a method includes forming a device feature over a wafer, the device feature including exposed sidewalls; exposing the wafer to an ion beam, the exposed sidewalls of the device feature being modified by the ion beam; and moving the wafer along a scan line with respect to the ion beam, the ion beam traveling a first distance to contact a leading edge of the wafer, the ion beam traveling a second distance to contact a trailing edge of the wafer, and a scan angle defined between the scan line and an axis perpendicular to an axis of the ion beam being set such that a difference between the first distance and the second distance is less than 229.8 mm. In an embodiment, the scan angle is equal to or less than 60°, and moving the wafer along the scan line includes moving the wafer a first distance ranging from 0 mm to 520 mm in a direction parallel to the ion beam and moving the wafer a second distance ranging from 300 mm to 600 mm in a direction perpendicular to the ion beam. In an embodiment, a surface of the wafer is tilted at a tilt angle with respect to the ion beam, and a difference between the scan angle and the tilt angle is less than 50°. In an embodiment, the tilt angle is from 40° to 89.9°. In an embodiment, a surface of the wafer is tilted at a tilt angle with respect to the ion beam, and the scan angle is greater than 0° and less than the tilt angle when the tilt angle is greater than 0°. In an embodiment, ions are implanted into the exposed sidewalls of the device feature by exposing the wafer to the ion beam. In an embodiment, the exposed sidewalls of the device feature are etched by exposing the wafer to the ion beam.

In accordance with yet another embodiment, a method includes providing a substrate; exposing a surface of the substrate to an ion beam, the surface of the substrate being tilted at a tilt angle with respect to an axis of the ion beam, wherein the tilt angle is from 40° to 89.9°; and moving the substrate with respect to the ion beam, the substrate moving along a scan line, a scan angle between the scan line and an axis perpendicular to the axis of the ion beam being greater than 0° and less than the tilt angle. In an embodiment, a difference between the scan angle and the tilt angle is less than 50°. In an embodiment, the ion beam strikes a leading edge of the substrate after traveling a first distance, the ion beam strikes a trailing edge of the substrate after traveling a second distance, and the scan angle is set such that a difference between the second distance and the first distance is less than 229.8 mm. In an embodiment, the substrate is moved and tilted by a wafer handling unit. In an embodiment, the tilt angle is from 60° to 89.9°. In an embodiment, the scan angle is less than 60°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first layer over a substrate;
   forming a second layer over the first layer;
   exposing the second layer to a first ion beam, wherein the substrate is tilted at a tilt angle with respect to an axis of the first ion beam, the tilt angle being measured between the axis of the first ion beam and an upper surface of the substrate, wherein the tilt angle is greater than 0°; and
   moving the substrate with respect to the first ion beam while exposing the second layer to the first ion beam, wherein the substrate moves along a scan line, wherein a scan angle between the scan line and a line perpendicular to the axis of the first ion beam, wherein the scan angle is greater than 0°.

2. The method of claim 1, wherein the scan angle is different from the tilt angle.

3. The method of claim 1, wherein the second layer is a photosensitive layer comprising a first opening.

4. The method of claim 3, wherein the first ion beam implants a sidewall of the first opening.

5. The method of claim 3, wherein the first ion beam etches a sidewall of the first opening.

6. The method of claim 3, further comprising performing an etching process using the second layer as a mask to form a second opening in the first layer, wherein the second opening is vertically aligned with the first opening.

7. The method of claim 1, further comprising forming a third layer over the substrate before forming the first layer, wherein the method further comprises etching the third layer using the first layer as a mask.

8. A method comprising:
   forming a first layer over a wafer;
      forming a second layer having a first pattern over the first layer;
      etching the first layer using the second layer as a mask to form a second pattern in the first layer, the second pattern vertically corresponding to the first pattern;
      exposing the first layer and the second layer to a first ion beam, wherein the wafer is tilted at a first tilt angle with respect to an axis of the first ion beam, the first tilt angle being measured between the axis of the first ion beam and an upper surface of the wafer is greater than 0°; and
   moving the wafer with respect to the first ion beam while exposing the first layer and the second layer to the first ion beam, wherein the wafer moves along a scan line, wherein a first scan angle between the scan line and a line perpendicular to the axis of the first ion beam is greater than 0°.

9. The method of claim 8, wherein a sidewall of the first pattern of the second layer is hardened by being exposed to the first ion beam.

10. The method of claim 8, wherein a sidewall of the second pattern of the first layer and a sidewall of the first pattern of the second layer are hardened by being exposed to the first ion beam.

11. The method of claim 8, wherein forming the first pattern of the second layer comprises:
   depositing a photosensitive material over the first layer;
   exposing the photosensitive material to a patterned energy source;
   removing unexposed portions of the photosensitive material to form a third pattern in the photosensitive material; and
   modifying the third pattern of the photosensitive material to the first pattern.

12. The method of claim 11, wherein modifying the third pattern of the photosensitive material to the first pattern comprises:
   exposing the photosensitive material to a second ion beam, wherein the wafer is tilted at a second tilt angle with respect to an axis of the second ion beam, the second tilt angle being measured between the axis of the second ion beam and the upper surface of the wafer; and
   moving the wafer with respect to the second ion beam while exposing the photosensitive material to the second ion beam, wherein the wafer moves along the scan line, wherein a second scan angle between the scan line and a line perpendicular to the axis of the first ion beam is different from the second tilt angle.

13. The method of claim 8, wherein the wafer is tilted by a wafer handling unit, wherein the wafer handling unit comprises a first motor configured to control a position of the wafer handling unit in a first direction and a second motor configured to control a position of the wafer handling unit in a second direction.

14. The method of claim 8, wherein the first tilt angle is different from the first scan angle.

15. A method comprising:
   forming a patterned mask layer over a substrate, wherein the patterned mask layer has a first pattern;
   performing a first etching process on the patterned mask layer to modify the first pattern to a second pattern, wherein the first etching process comprises:
      exposing the substrate to a first ion beam, wherein the substrate is tilted at a first tilt angle with respect to the first ion beam; and
      moving the substrate along a first scan line with respect to the first ion beam, wherein a first scan angle is defined between the first scan line and a line perpendicular to an axis of the first ion beam, wherein the first tilt angle is greater than 0°, and the first scan angle is greater than 0°; and
   performing a second etching process on the substrate according to the second pattern, wherein the second etching process comprises exposing exposed portions of the substrate to a second ion beam, an axis of the second ion beam is perpendicular to a bottom surface of the substrate.

16. The method of claim 15, wherein the first ion beam etches a sidewall of the patterned mask layer.

17. The method of claim 15, further comprising exposing a sidewall of remaining portions of the substrate to a third ion beam after the second etching process, wherein the third ion beam comprises implantation species.

18. The method of claim 17, further comprising tilting the substrate at a second tilt angle with respect to the third ion beam and moving the substrate along a second scan line with respect to the third ion beam, wherein a second scan angle is defined between the second scan line and a line perpendicular to an axis of the third ion beam, wherein the second scan angle is different from the second tilt angle.

19. The method of claim 17, further comprising removing the patterned mask layer before exposing the substrate to the third ion beam.

20. The method of claim 15, wherein moving the substrate along the first scan line comprises moving the substrate a first distance ranging from greater than 0 mm to 520 mm in a direction parallel to the first ion beam and moving the substrate a second distance ranging from 300 mm to 600 mm in a direction perpendicular to the first ion beam.

\* \* \* \* \*